(12) United States Patent
Hsu

(10) Patent No.: US 6,204,185 B1
(45) Date of Patent: Mar. 20, 2001

(54) METHOD FOR FORMING SELF-ALIGN STOP LAYER FOR BORDERLESS CONTACT PROCESS

(75) Inventor: Shih-Ying Hsu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/316,993

(22) Filed: May 24, 1999

(51) Int. Cl.$^7$ .................................................. H01L 21/00
(52) U.S. Cl. ............................ 438/692; 216/38; 438/734; 438/740; 438/745
(58) Field of Search .................................... 438/692, 719, 438/723, 724, 734, 740, 745; 216/38, 79, 88

(56) References Cited

U.S. PATENT DOCUMENTS 5,759,867 * 6/1998 Armacost et al. ................ 438/740 X
5,935,875 * 8/1999 Lee .................................... 438/740 X

* cited by examiner

Primary Examiner—William Powell

(57) ABSTRACT

A method for forming a self-align stop layer for borderless contact process is disclosed. In one embodiment, the present invention provides a semiconductor device which can simplify borderless contact fabrication, which includes providing a substrate incorporating a device. Sequentially, a pad oxide, a pad polysilicon, and a first dielectric layer are formed over the substrate. A first photoresist layer is formed over the first dielectric layer and then the first dielectric layer, the pad polysilicon, the pad oxide, and the substrate are etched using the photoresist layer as a mask to form an isolation inside said substrate. Consequentially, a second dielectric layer is deposited over the device and the isolation inside the substrate. The second dielectric layer is removed wherein the surface of the second dielectric layer is lower than the top surface of the substrate by a chemical mechanical polishing (CMP) and etching back. Next, a third dielectric layer is deposited over the device and within the isolation to form a self-align stop layer, wherein the third dielectric layer, the first dielectric layer, and a portion of the pad polysilicon layer are removed by a planarization process. Finally, said pad polysilicon layer and pad oxide layer are removed until a portion of the surface of said substrate is exposed, and then a gate oxide is formed over said substrate.

8 Claims, 5 Drawing Sheets

METHOD FOR FORMING SELF-ALIGN STOP LAYER FOR BORDERLESS CONTACT PROCESS

BACKGROUND OF THE INVENTION

1. Field of the Invention

The present invention relates to a borderless contact process, and more particularly, to a semiconductor device including a self-align stop layer for borderless contact process within shallow trench isolation. The provided semiconductor device can be simplified and result in fine borderless contact fabrication.

2. Description of the Prior Art

Recently, demand for semiconductor devices has rapidly increased owing to widespread use of integrated circuits (ICs). More particularly, as more than hundreds or thousands of electrical components are integrated into the ICs, a means for improving quality and reducing critical dimension of semiconductor devices has become imperative. Accordingly, with misalignment tolerance for the borderless contact formation, so silicon nitride layer must be used as a stop layer of borderless contact etching to avoid the oxide recess which will induce junction leakage currents.

In the sub-micro dimension, a borderless contact process is used to save the layout area. This usually needs a stop layer cap (for example, silicon nitride layer 300) in interlayer dielectric (ILD) 320 layer to prevent junction from damage for shallow trench isolation (STI) 200 process during the contact etch step. In the contact etching step, first, oxide was etched and stooped on silicon nitride layer 300, and then the silicon nitride cap layer was etched and prevented from over-etching (e.g., oxide loss was controlled at the shallow trench isolation) to attack junction. This stop layer makes contact etching scheme complicated.

FIGS. 1A to 1D show cross-sectional views of a traditional semiconductor device, where the structure shown in FIG. 1D has additional gate oxide 120 and polysilicon layer 220. An N-type semiconductor device, for example, has a source/drain region 280B and 280C doped with N-type ions, which are usually designated as N$^+$ regions. The substrate 100 usually has a P-type well, and the gate 220 is composed of polysilicon, and the spacers 260.

For submicron technology, the shallow trench isolation (STI) was employed for global planarization process. However, an oxide recess (especially as the corner of STI) will happen during the post-wet-dip treatment in STI process, and thus subthreshold kink effect will happen.

On the other hand, small contact was necessary to meet the requirement of the design rule, and thus the borderless contact was used to increase the critical dimension of contact size and process margin for small contact formation.

SUMMARY OF THE INVENTION

In accordance with the present invention, a semiconductor device is provided for achieving a larger process margin. Primarily, the purpose of the present invention provides means for manufacturing a semiconductor device with silicon nitride layer within shallow trench isolation as a self-align stop layer for borderless contact process, so that the provided semiconductor device can be adapted to achieve more simplified fabrication.

Another purpose of the present invention is to provide a semiconductor device with a self-aligned stop layer composed of silicon nitride within shallow trench isolation (STI). Therefore, borderless contact etching process only needs to etch oxide layer and no need to breakthrough stop layer on diffusion. Borderless contact etching can be stopped on the silicon nitride layer within shallow trench isolation to avoid junction leakage.

In one embodiment, the present invention provides a semiconductor device that can simplify borderless contact fabrication, which includes a self-align stop layer for borderless contact process within shallow trench isolation. Next, a pad oxide, a pad polysilicon, and a first silicon nitride layer are formed in order over the substrate. A first photoresist layer is formed over the first silicon nitride layer. Consequentially, the first silicon nitride layer, the pad polysilicon, said the pad oxide, and the substrate are etched using the photoresist layer as a mask to form shallow trench isolation inside the silicon substrate. A first silicon dioxide layer is deposited over the device and shallow trench isolation inside the silicon substrate. Then, the first silicon dioxide layer is removed by using first silicon nitride layer as a stop layer, wherein the surface of the first silicon dioxide layer within STI is lower than top surface of the silicon substrate by a chemical mechanical polishing (CMP) and etching back. Next, a second silicon nitride layer is deposited over the wafer and the shallow trench isolation inside the silicon substrate, and used second silicon nitride layer as a stop layer of a borderless contact. Wherein the first silicon nitride layer and a portion of the pad polysilicon layer are removed by a CMP process which used pad polysilicon layer as a stop layer. Hence, the remaining pad polysilicon layer and the pad oxide layer are removed until a portion of the surface of the silicon substrate is exposed. A gate oxide is formed over the silicon substrate, thus forming a polysilicon layer on the gate oxide layer. Then, the polysilicon layer is etched to form a gate. Consequentially, first ions of a first conductive type are implanted into the silicon substrate. And forming a third silicon nitride spacer on sidewall of the gate. Second ions of the first conductive type are implanted into the silicon substrate to form source/drain regions using the spacer as a mask, wherein concentration of the implanted second ions is greater than concentration of the implanted first ions. Finally, an inter-layer dielectric is deposited over the silicon substrate, followed by a planarization process such as chemical mechanical polishing (CMP), wherein the inter-layer dielectric is etched to form a borderless contact therein between the isolation and source/drain regions.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
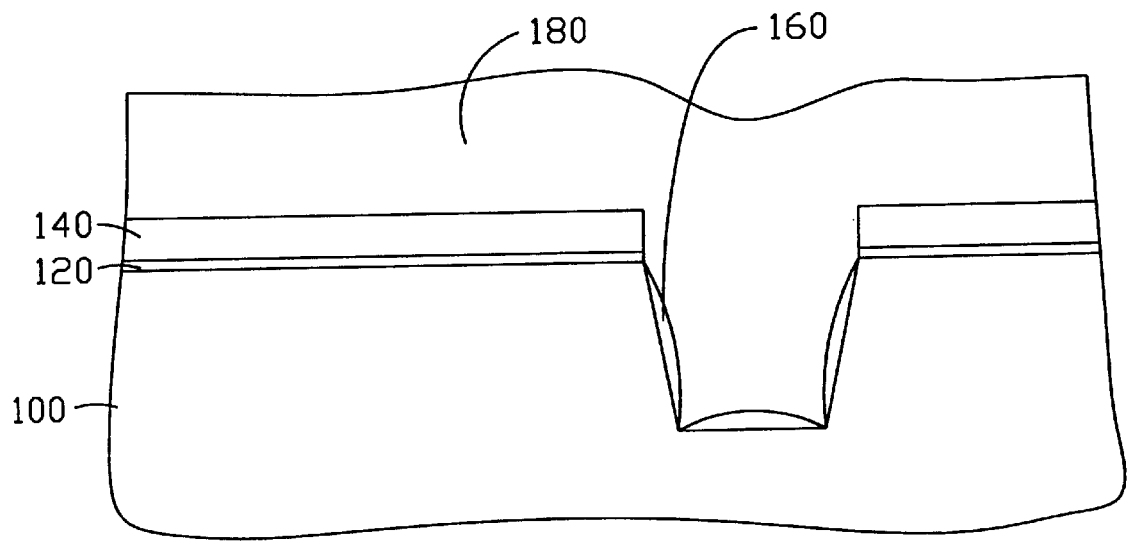
FIGS. 1A to 1D show cross-sectional views of a traditional semiconductor device.
Figure 1B:
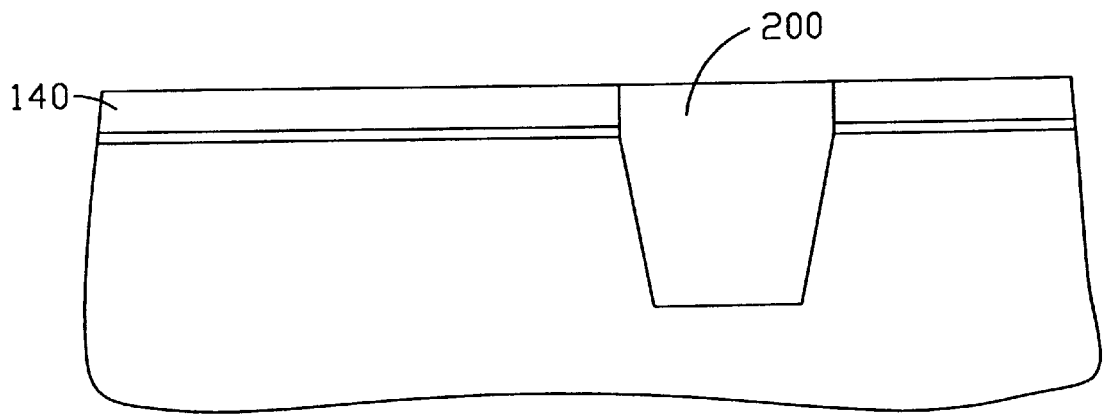
Figure 1C:
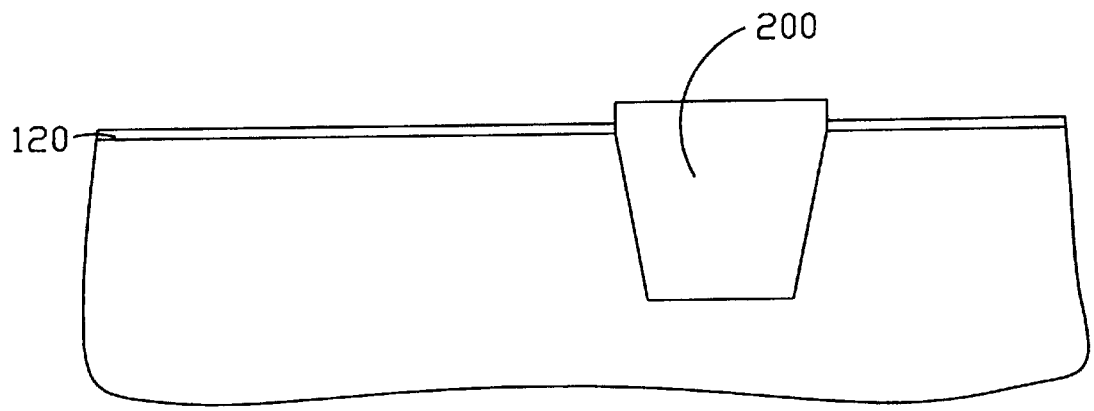
Figure 1D:
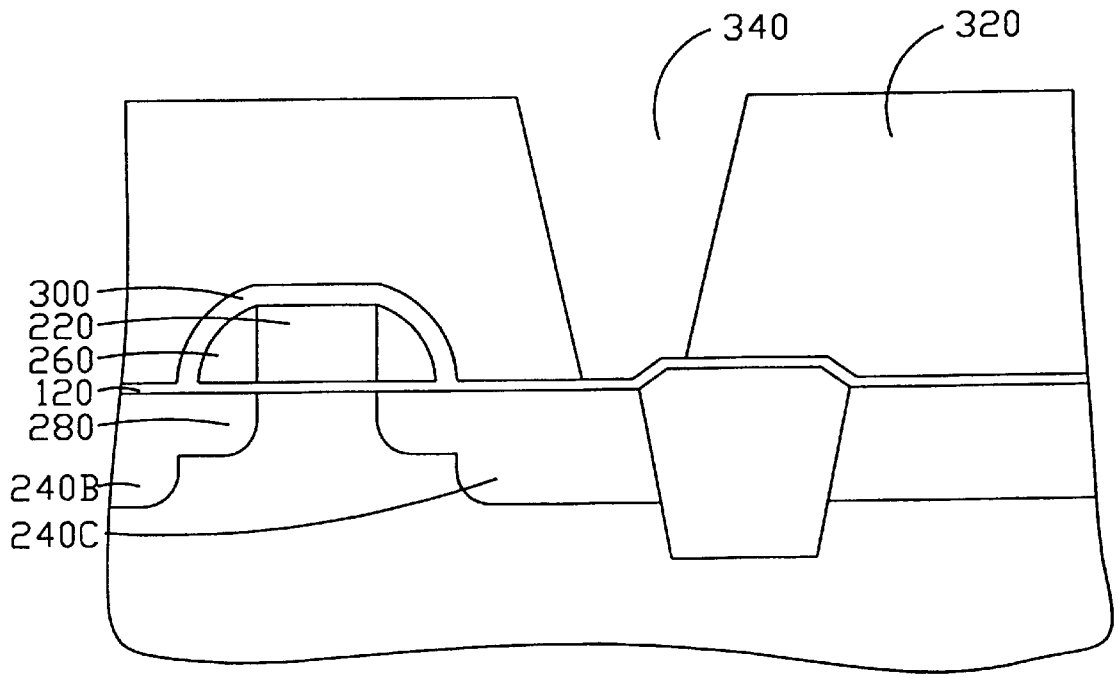
Figure 2:
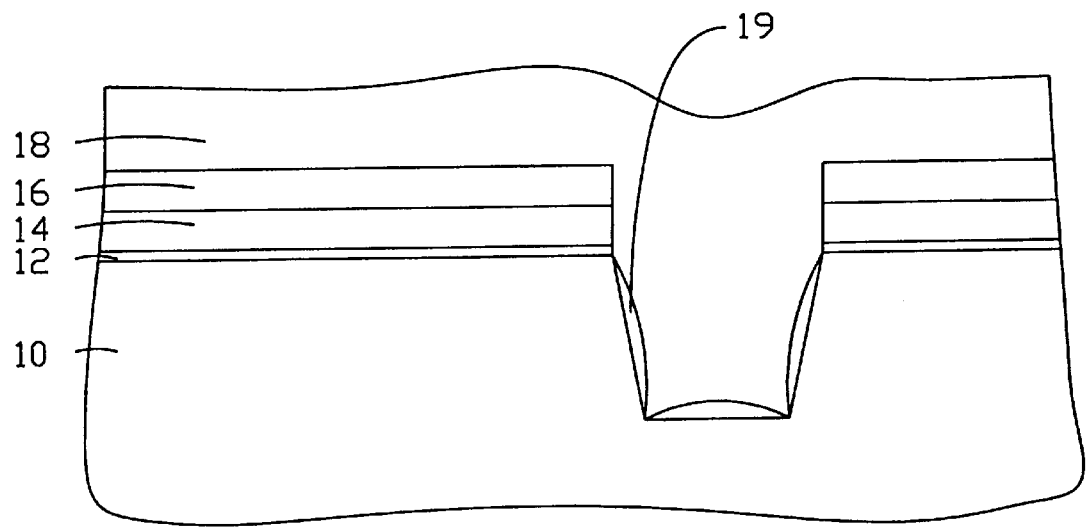
FIGS. 2 to 6 show cross-sectional views of various stages in the fabrication of a semiconductor device in accordance with one embodiment of the present invention.

Referring to FIG. 2, a silicon substrate 10 with p type conductivity is firstly provided. It is appreciated that a semiconductor substrate with n type conductivity can also be used. A pad oxide 12 of about 100–300 angstroms abuts on semiconductor device 10 by traditional oxide technique. Next, a pad polysilicon 14 with a thickness of about 1000–3000 angstroms is deposited on the pad oxide 12, by example, a traditional chemical vapor deposition (CVD) method. A silicon nitride layer 16 is formed on the pad polysilicon 14 with a thickness of about 1000–3000 angstroms. Using a photoresist layer as a mask above the silicon nitride 16 by conventional photolithography techniques, silicon substrate 10 is then isotropically etched to form shallow trench isolation (STI) inside the silicon substrate 10. A first silicon dioxide layer 18 is deposited over the device and within the isolation, wherein the shallow isolation region is composed of silicon dioxide, generally followed by a planarization process such as chemical mechanical polishing (CMP).

Figure 3:
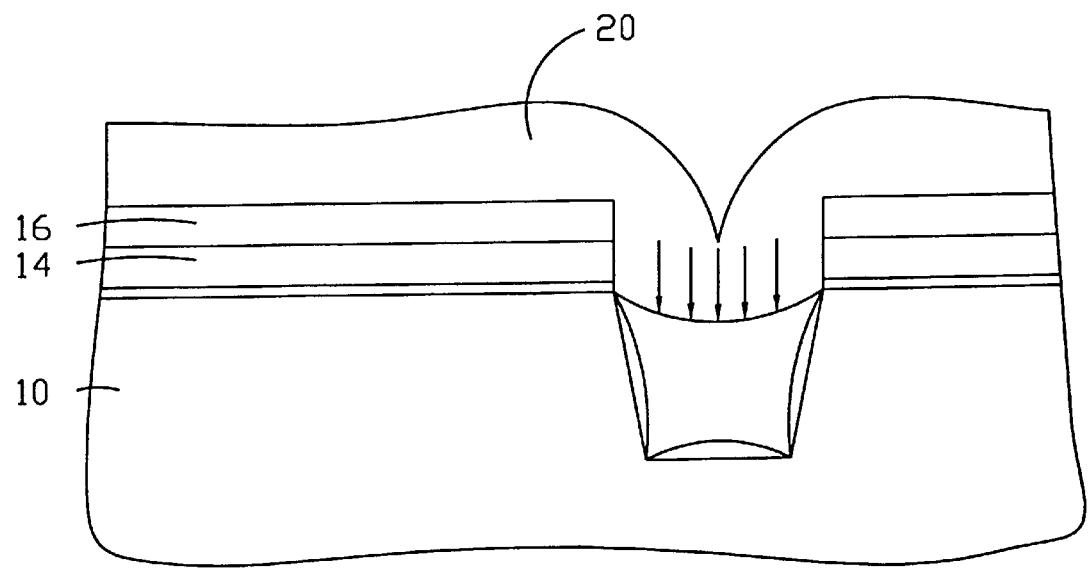

Part of the silicon dioxide layer 18 is removed to stop on the silicon nitride layer 16, wherein surface of silicon dioxide layer 18A is lower than top surface of said substrate about 500–1000 angstroms by a chemical mechanical polishing (CMP) and etching back as shown in FIG. 3. Sequentially, a second silicon nitride layer 20 is deposited over the device and silicon oxide layer 18A of the shallow trench isolation.

Figure 4:
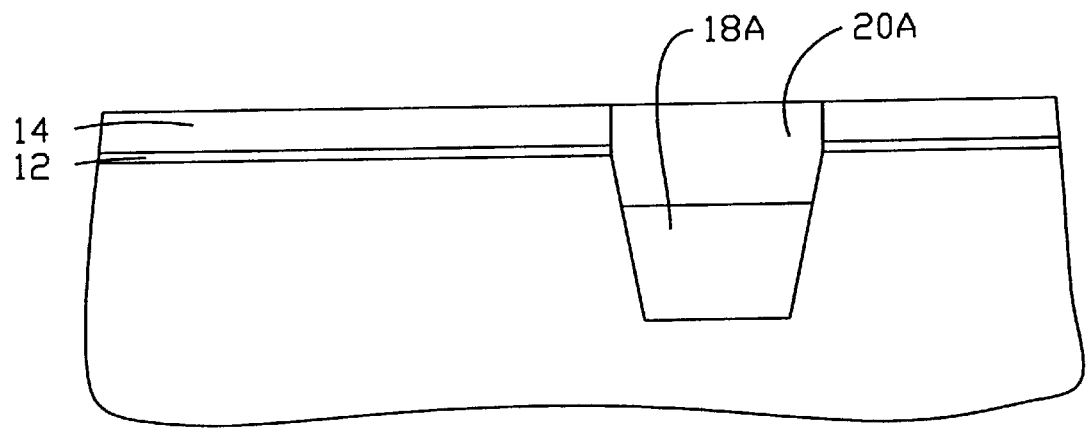

Referring to FIG. 4, the part of second silicon nitride layer 20, and residue silicon nitride 16A are removed to stop on the pad polysilicon layer14A by a planarization process such as chemical mechanical polishing (CMP).

Figure 5:
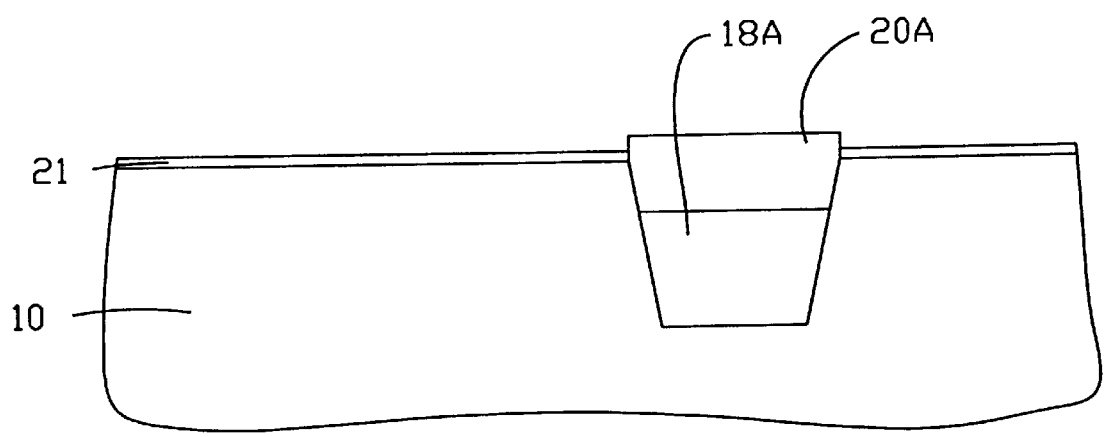

Referring to FIG. 5, removing said remained pad polysilicon layer 14A and the pad oxide 12 until a portion of surface of the silicon substrate 10 is exposed by an anisotropically etching, wherein the shallow isolation region is composed of the silicon dioxide 18A and the silicon nitride 20A. Then, the silicon nitride 20A is used a self-align stop layer for borderless contact process.

Figure 6:
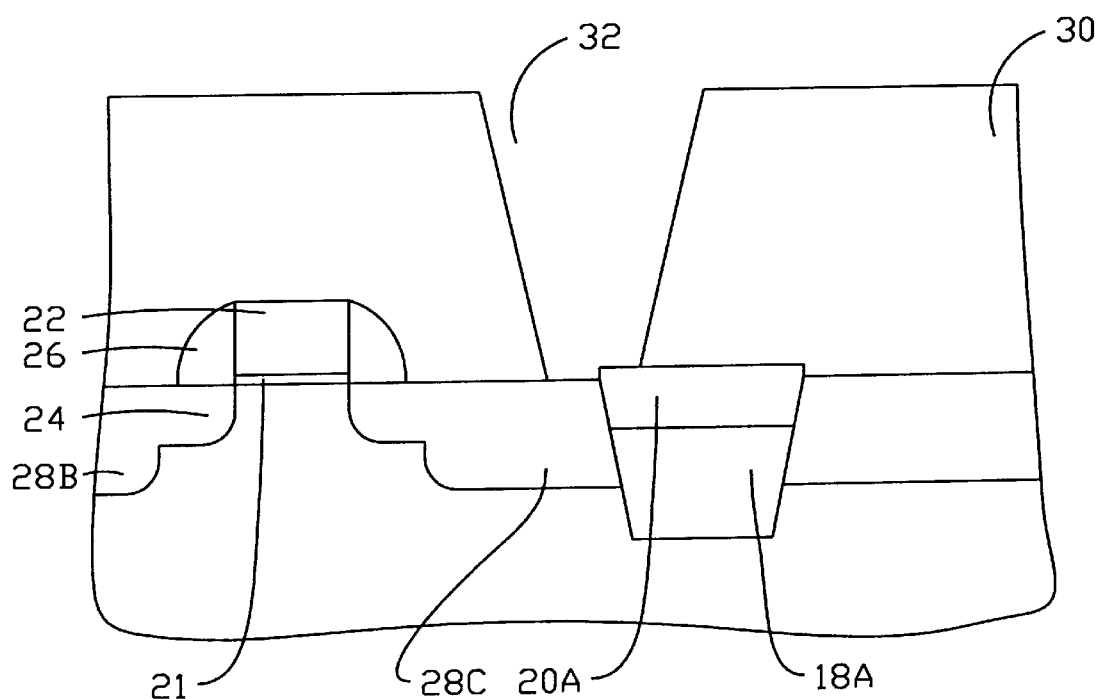

Finally, referring to FIG. 6, a well and threshold voltage adjusting implant is performed in the silicon substrate 10. The substrate 10 is then subjected to an oxidation process, such as a dry oxidation technique, thereby growing a silicon oxide layer on the silicon substrate 10 up to about 50–150 angstroms in thickness. The silicon oxide layer is used as a gate oxide layer 21. Subsequently, a polysilicon layer 22 having thickness of about 2000–3000 angstroms is deposited on the gate oxide layer 21, followed by implanting arsenic or phosphorus atoms inside the polysilicon layer (no shown) to reduce the resistivity. A photoresist layer (no shown) is formed and patterned on the polysilicon layer using standard photolithography techniques, defining a gate 22 area over a portion of the polysilicon layer. Subsequently, using the gate 22 of semiconductor device as a doping mask, N-type ions, such as ions Phosphorus are then implanted into the substrate 10, thus forming a lightly doped drain regions 24, which is mainly used to improve the short channel effect, and is generally designated as N$^-$. In this embodiment, the implanted dosage is about $10^{13}/cm^2$. Using the spacer 26 as an implant mask, N-type ions such as Phosphorus or Arsenic are implanted into the substrate 10, thus forming heavily doped source/drain regions 28B and 28C. The concentration of the implanted ions is about $10^{15}/cm^2$, and is usually designated as N$^+$. It is noted that the concentration of the heavily doped regions 28B and 28C is higher than the concentration of the lightly doped region 24 mentioned above. Consequentially, an inter-layer dielectric 30 (ILD) such as silicon oxide layer is deposited over the substrate 10, generally followed by a planarization process such as chemical mechanical polishing (CMP). Using conventional photolithography techniques to define a borderless contact 32, the inter-layer dielectric layer 30 is then patterned and etched to form a contact. The etching selectivity between ILD 30 and self-align stop layer 20A can be well tuned to make contact etching stop on self-align stop layer 20A.

According to the aforementioned process of the present invention, the shallow trench isolation with silicon nitride layer 20A is provided, so that the provided semiconductor device can get simplified borderless contact fabrication. Therefore, more compatibility with borderless contact process in semiconductor device can be obtained.

Although specific embodiments have been illustrated and described, it will be obvious to those skilled in the art that various modifications may be made without departing from what is intended to be limited solely by the appended claims.

What is claimed is:

1. A method for forming a semiconductor device, comprising:

providing a substrate incorporating a device;

in order forming a pad oxide, a pad polysilicon, and a first dielectric layer over said substrate;

forming a first photoresist layer over said first dielectric layer;

etching said first dielectric layer, said pad polysilicon, said pad oxide, and said substrate using said photoresist layer as a mask to form an isolation inside said substrate;

depositing a second dielectric layer over said device and said isolation inside said substrate;

removing said second dielectric layer wherein surface of said second dielectric layer is lower than top surface of said substrate by a chemical mechanical polishing (CMP) and etching back;

depositing a third dielectric layer over said device and said isolation inside said substrate to form a self-align stop layer, wherein said third dielectric layer, and said first dielectric layer are removed by a planarization process;

removing said pad polysilicon layer and said pad oxide layer until a portion of surface of said substrate is exposed; and forming a gate oxide over said substrate.

2. The method according to claim 1, wherein said first dielectric layer comprises silicon nitride.

3. The method according to claim 1, wherein said second dielectric layer comprises silicon dioxide.

4. The method according to claim 1, wherein said third dielectric layer comprises silicon nitride.

5. The method according to claim 1, wherein said gate oxide layer comprises silicon dioxide.

6. A method for forming a semiconductor device, comprising:

providing a silicon substrate incorporating a device;

in order forming a pad oxide, a pad polysilicon, and a first silicon nitride layer over said substrate;

forming a first photoresist layer over said first silicon nitride layer;

etching said first silicon nitride layer, said pad polysilicon, said pad oxide, and said substrate using said photoresist layer as a mask to form a shallow trench isolation inside said silicon substrate;

depositing a first silicon dioxide layer over said device and said shallow trench isolation inside said silicon substrate;

removing said first silicon dioxide layer, wherein surface of said first silicon dioxide layer is lower than top surface of said silicon substrate by a chemical mechanical polishing (CMP) and etching back;

depositing a second silicon nitride layer over said device and said shallow trench isolation inside said silicon substrate, used second silicon nitride layer as a self-align stop layer for a borderless contact, wherein said first silicon nitride layer and said pad polysilicon layer are removed by a planarization process of CMP which used pad polysilicon layer as a stop layer;

removing said pad polysilicon layer and pad oxide layer until a portion of surface of said silicon substrate is exposed;

forming a gate oxide over said silicon substrate;

forming a polysilicon layer on said gate oxide layer;

patterning to etch said polysilicon layer to form a gate;

implanting first ions of a first conductive type into said silicon substrate;

forming a third silicon nitride spacer on sidewall of said gate;

implanting second ions of the first conductive type into said silicon substrate to form source/drain regions using said spacer as a mask, wherein concentration of said implanted second ions is greater than concentration of said implanted first ions; and an inter-layer dielectric deposited over said silicon substrate, followed by a planarization process such as chemical mechanical polishing (CMP), wherein said inter-layer dielectric is etched to form a borderless contact therein between said isolation and source/drain regions.

7. The method according to claim 6, wherein said gate oxide layer is formed by a thermal oxidization method.

8. The method according to claim 6, wherein said polysilicon gate is doped with ions Phosphorus or Arsenic.

* * * * *